(12) United States Patent
Kim et al.

(10) Patent No.: US 7,791,377 B2
(45) Date of Patent: Sep. 7, 2010

(54) HIERARCHICAL TIME TO DIGITAL CONVERTER

(75) Inventors: Chulwoo Kim, Seoul (KR); Minyoung Song, Seoul (KR); Sunghoon Ahn, Namyangju (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 0 days.

(21) Appl. No.: 12/033,782

(22) Filed: Feb. 19, 2008

(65) Prior Publication Data
US 2009/0028274 A1    Jan. 29, 2009

(30) Foreign Application Priority Data
Jul. 24, 2007    (KR) ............... 10-2007-0073967

(51) Int. Cl.
G01R 29/00    (2006.01)
H03D 3/00    (2006.01)
H03D 9/00    (2006.01)

(52) U.S. Cl. .................................. 327/2; 375/239
(58) Field of Classification Search .................. 327/158
See application file for complete search history.

(56) References Cited
U.S. PATENT DOCUMENTS
5,345,234 A    9/1994    Stewart et al.

6,429,693 B1    8/2002    Staszewski et al.
2005/0189974 A1    9/2005    Chao
2008/0012549 A1*   1/2008    Kam et al. ............... 324/76.54

FOREIGN PATENT DOCUMENTS
KR    20040033630    4/2004

* cited by examiner

*Primary Examiner*—Lincoln Donovan
*Assistant Examiner*—Daniel Rojas
(74) *Attorney, Agent, or Firm*—Rabin & Berdo, P.C.

(57) ABSTRACT

A time to digital converter having a hierarchical structure is provided. The time to digital converter includes: a plurality of delay stages for sequentially delaying a first signal for a specific delay time; a plurality of flip-flops for comparing delay signals of the first signal delayed by the delay stages with a second signal, and generating different outputs before and after a phase difference between the delay signals of the first signal and the second signal becomes smaller than a resolution of the phase detector; a selection signal generator for generating a selection signal for selecting a signal most similar to the second signal among the delay signals of the first signal from the outputs of the flip-flops; and a Multiplexer (MUX) for receiving the delay signals of the first signal and the selection signal, and outputting the signal most similar to the second signal among the delay signals of the first signal.

9 Claims, 3 Drawing Sheets

HIERARCHICAL TIME TO DIGITAL CONVERTER

CROSS-REFERENCE TO RELATED APPLICATION

This application claims the benefit of Korean Patent Application No. 2007-0073967, filed Jul. 24, 2007, the disclosure of which is hereby incorporated herein by reference in its entirety.

BACKGROUND OF THE INVENTION

1. Field of the Invention

The present invention relates to a hierarchical time to digital converter, and more particularly, to a hierarchical time to digital converter in which a resolution is increased by stages while a phase is compensated for to implement a high resolution and a wide phase detection range.

2. Description of the Related Art

With development of semiconductor manufacturing process technology, circuit line widths have been reduced, and thus the degree of circuit integration is increasing. In addition, reduction in supplied voltage level is resulting in decrease in power consumption. However, the reduction in circuit line width causes an increase in leakage current and results in deterioration in performance of analog circuits. Therefore, circuit design technology is becoming digitized according to the development of process technology.

Currently, time to digital converters represent the most basic and effective technology for digitizing a circuit. A time to digital converter can be designed using a digital circuit alone. Since the time to digital converter converts a phase difference between clocks into a digital signal, it readily processes an output as a digital signal. Therefore, not only can a time to digital converter be widely used in a clock generator designed using a digital circuit, but it can also be effectively used in some Analog-Digital Converters (ADCs).

A conventional basic time to digital converter may be designed as illustrated in FIG. 1. Referring to FIG. 1, a clock $IN_1$ is sampled by a clock $IN_2$ after a specific delay T caused by delay stages 101_1, 101_2, . . . , 101_N and 101_N+1 having the specific delay T. More specifically, flip-flops 103_1, 103_2, . . . , 103_N and 103_N+1 output signal values of the clock $IN_1$ delayed by the delay stages as output values THR<0>, THR<1>, . . . , THR<N−1> and THR<N> at a rising edge of the clock $IN_2$. Here, the time to digital converter counts a value of 1 among the output values THR<0>, THR<1>, . . . , THR<N−1> and THR<N> of the flip-flops 103_1, 103_2, . . . , 103_N and 103_N+1. The counted number of is a phase difference between the clocks $IN_1$ and $IN_2$. Therefore, a position having the minimum phase difference is found, and the phase difference of the position is output in a digital code. However, the time to digital converter cannot detect a phase difference within the specific delay T. The delay T of the time to digital converter is referred to as a resolution of the time to digital converter, which is determined by a phase difference caused by basic delay circuits of the delay stages. In general, a basic delay circuit is made of two inverters having the minimum delay, and it is impossible to make a time to digital converter having a smaller resolution than that of the basic delay circuit renders.

FIG. 2 is a circuit diagram of a time to digital converter having an improved resolution in comparison with the time to digital converter shown in FIG. 1. Two clocks $IN_1$ and $IN_2$ are input into delay stages having a minute difference and sampled with a delay difference of $(\tau_1-\tau_2)$. Thus, a resolution is improved in comparison with that of the time to digital converter of FIG. 1.

However, when the resolution of the conventional time to digital converter increases, a phase detection range is reduced. To solve this problem, more delay stages and sampling circuits are necessary. Consequently, the size of the time to digital converter must be increased in order to satisfy a phase detection range and a resolution simultaneously.

SUMMARY OF THE INVENTION

The present invention is directed to a new time to digital converter that increases a resolution and compensates for a phase difference by stages using a hierarchical structure to drastically reduce a size of a circuit while simultaneously satisfying a wide phase detection range and a high resolution, and thus has a phase detection range varies according to the resolution.

A first aspect of the present invention provides a time to digital converter for detecting a phase difference between a first signal and a second signal, including: a plurality of delay stages for sequentially delaying the first signal for a specific delay time; a plurality of flip-flops for comparing delay signals of the first signal delayed by the delay stages with the second signal, and generating different outputs before and after a phase difference between the delay signals of the first signal and the second signal becomes smaller than a resolution of the phase detector; a selection signal generator for generating a selection signal for selecting a signal most similar to the second signal among the delay signals of the first signal from the outputs of the flip-flops; and a Multiplexer (MUX) for receiving the delay signals of the first signal and the selection signal, and outputting the signal most similar to the second signal among the delay signals of the first signal.

The output signal of the MUX and the second signal may be input into a time to digital converter in a next stage. The second signal may be passed through a buffer in consideration of an input load of the time to digital converter in the next stage. The flip-flops may generate and output values of the delay signals of the first signal at a rising edge of the second signal. The selection signal generator may receive outputs of two adjacent flip-flops, and generate the selection signal having a value of 1 when the outputs of the flip-flops are changed from 1 to 0. The selection signal generator may include an inverter gate and an AND gate.

A second aspect of the present invention provides a time to digital converter having a hierarchical structure, including: a first time to digital converter including delay stages having a delay time of $T_1$, which compensate for a phase difference between two signals to be less than $T_1$, and outputting the compensated signals to a time to digital converter in a next stage; and the second time to digital converter including delay stages having a delay time of $T_2$, which detect a phase difference between the output signals compensated by the first time to digital converter. Here, $T_1$ is greater than $T_2$.

The first time to digital converter may include: the delay stages for sequentially delaying a first signal among the two signals for a specific delay time; a plurality of flip-flops for comparing delay signals of the first signal delayed by the delay stages with a second signal among the two signals, and generating different outputs before and after a phase difference between the delay signals of the first signal and the second signal becomes smaller than a resolution of the time to digital converter; a selection signal generator for generating a selection signal for selecting a signal most similar to the second signal among the delay signals of the first signal from the outputs of the flip-flops; and a MUX for receiving the delay signals of the first signal and the selection signal, and outputting the signal most similar to the second signal among the delay signals of the first signal. Outputs of the first time to digital converter may be the second signal and the signal most similar to the second signal among the delay signals of the first signal.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. The present invention is not limited to the exemplary embodiments disclosed below, but rather can be implemented in various forms. The following exemplary embodiments are described in order to fully enable those of ordinary skill in the art to embody and practice the present invention.

Figure 1:
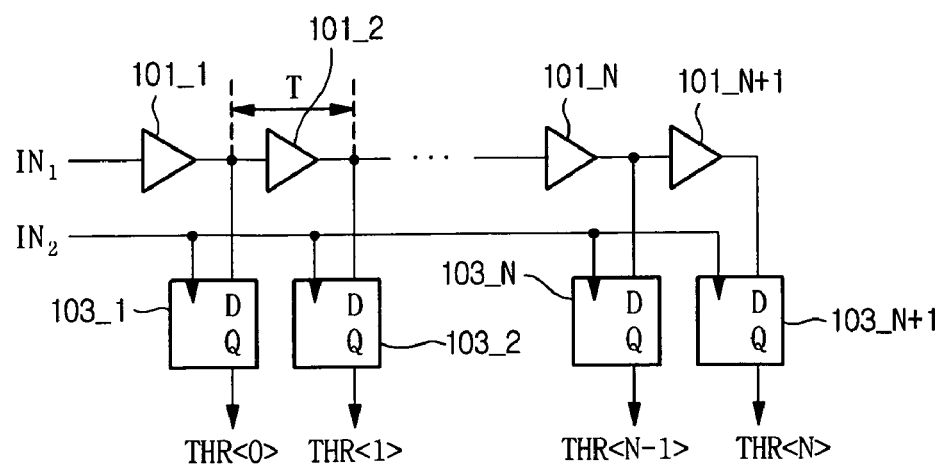
FIG. 1 is a block diagram of a conventional wide-range low-resolution time to digital converter.
Figure 2:
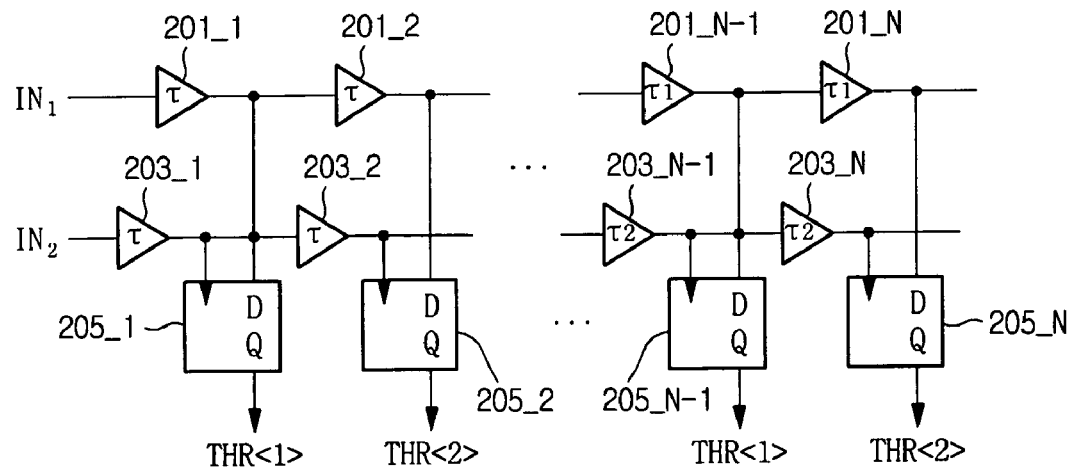
FIG. 2 is a block diagram of a conventional narrow-range high-resolution time to digital converter.
Figure 3:
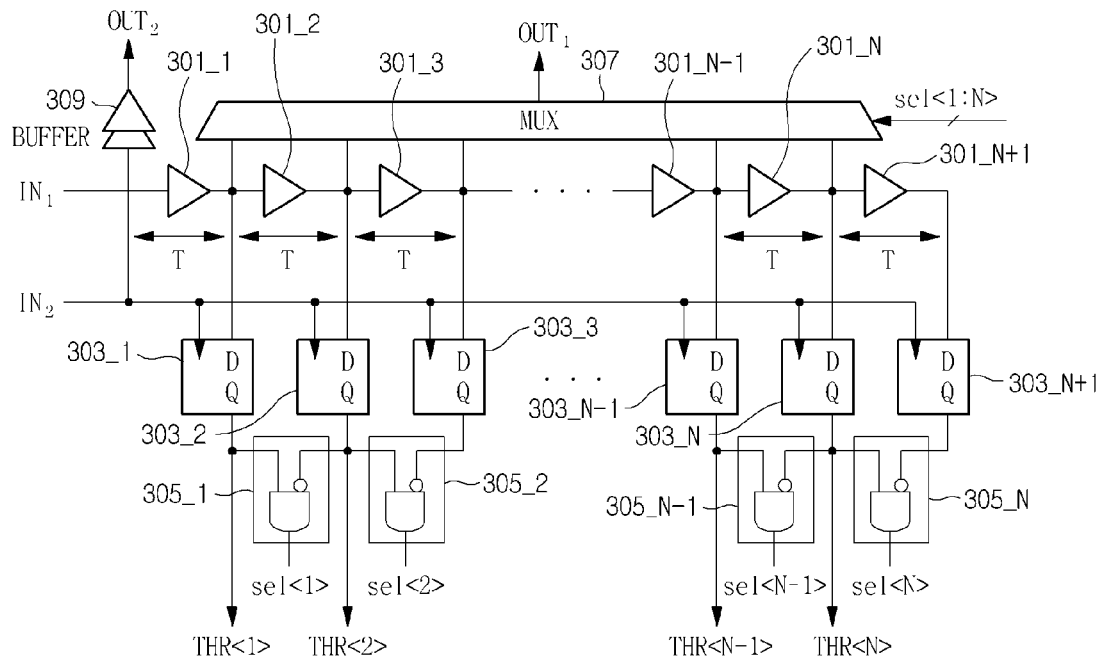
FIG. 3 is a circuit diagram of a time to digital converter according to an exemplary embodiment of the present invention.
Figure 4:
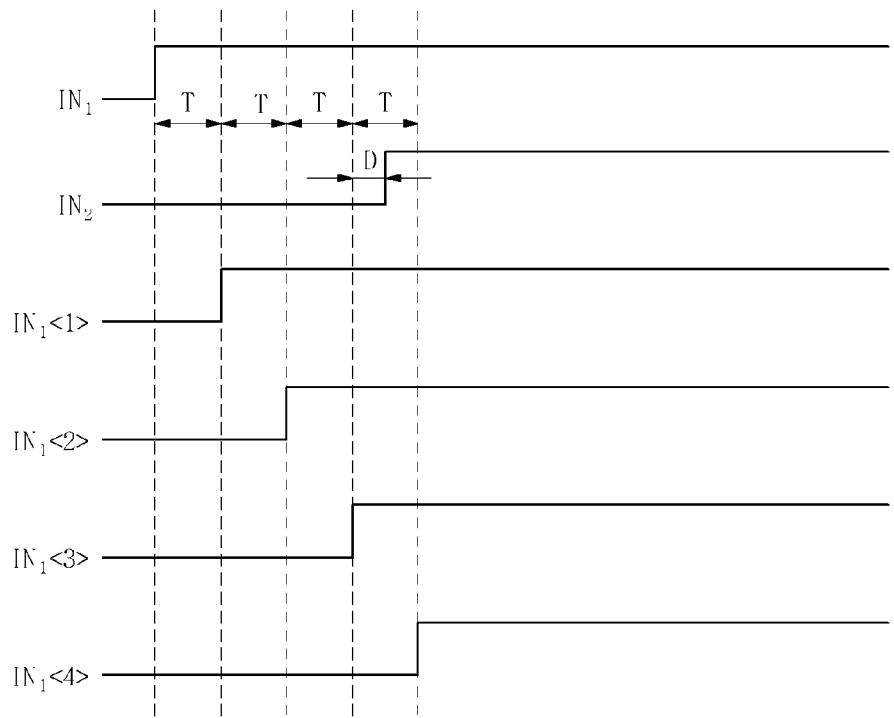
FIG. 4 is a timing diagram illustrating operation of a time to digital converter according to an exemplary embodiment of the present invention.

FIG. 3 is a circuit diagram of a time to digital converter according to an exemplary embodiment of the present invention, and FIG. 4 is a timing diagram illustrating operation of the time to digital converter according to an exemplary embodiment of the present invention.

Referring to FIGS. 3 and 4, the time to digital converter according to an exemplary embodiment of the present invention includes delay stages 301_1, 301_2, 301_3, ..., 301_N-1, 301_N and 301_N+1, flip-flops 303_1, 303_2, 303_3, 303_N-1, 303_N and 303_N+1, selection signal generators 305_1, 305_2, ..., 305_N-1 and 305_N, a Multiplexer (MUX) 307, and a buffer 309. The time to digital converter according to an exemplary embodiment of the present invention has a hierarchical structure. In the hierarchical structure, a time to digital converter having the lowest resolution but the widest phase detection range is employed in the initial stage, and time to digital converters having higher resolution but narrower phase detection range are employed sequentially in subsequent stages. In FIG. 3, input signals $IN_1$ and $IN_2$ denote objective signals whose phase difference is detected, and output signals $OUT_1$ and $OUT_2$ of the time to digital converter correspond to input signals of a time to digital converter in the next stage.

The delay stages 301_1, 301_2, 301_3, ..., 301_N-1, 301_N and 301_N+1 function to delay the input signal $IN_1$ for a specific delay time T. Assuming that the input signal $IN_1$ passed through the delay stage 301_1 is denoted by $IN_1<1>$, the signal $IN_1<1>$ is delayed for T in comparison with the input signal $IN_1$. Assuming again that the signal $IN_1<1>$ passed through the delay stage 301_2 is denoted by $IN_1<2>$, the signal $IN_1<2>$ is delayed for 2T in comparison with the input signal $IN_1$ (see FIG. 4).

The flip-flops 303_1, 303_2, 303_3, ..., 303_N-1, 303_N and 303_N+1 output values of the signals $IN_1<1>$, $IN_1<2>$, ..., $IN_1<N>$ of the input signal $IN_1$ delayed by the delay stages 301_1, 301_2, 301_3, ..., 301_N-1, 301_N and 301_N+1 as output values THR<0>, THR<1>, ..., THR<N-1> and THR<N> at a rising edge of the input signal $IN_2$.

The selection signal generators 305_1, 305_2, ..., 305_N-1 and 305_N include an AND gate and an inverter gate. The selection signal generators 305_1, 305_2, 305_N-1 and 305_N receive outputs of two adjacent flip flops and generate selection signals by which a signal most similar to the input signal $IN_2$ can be found among the delay signals $IN_1<1>$, $IN_1<2>$, ..., $IN_1<N>$ of the input signal $IN_1$.

The MUX 307 receives the delay signals $IN_1<1>$, $IN_1<2>$, ..., $IN_1<N>$ of the input signal $IN_1$ and the selection signals generated from the selection signal generators 305_1, 305_2, ..., 305_N-1 and 305_N and outputs as the output signal $OUT_1$ the signal most similar to the input signal $IN_2$ among the delay signals $IN_1<1>$, $IN_1<2>$, ..., $IN_1<N>$ of the input signal $IN_1$.

Meanwhile, the input signal $IN_2$ may be passed through the buffer 309 and output as the output signal $OUT_2$ in consideration of an input load of the time to digital converter in the next stage.

Operation of the time to digital converter will be described with reference to a case in which a difference between the input signals $IN_1$ and $IN_2$ is (3T+D) as shown in FIG. 4.

The delay signals $IN_1<1>$, $IN_1<2>$, $IN_1<3>$ and $IN_1<4>$ of the input signal $IN_1$ passed through the delay stages 301_1, 301_2, 301_3 and 301_4 are as shown in FIG. 4. Here, all of the output signals THR<1>, THR<2> and THR<3> of the flip-flops 303_1, 303_2 and 303_3 are 1, and the output signal THR<4> of the flip-flop 303_4 is 0. All of the output signals of the flip-flops 303_5, 303_6, ..., 303_N and 303_N+1 occurring after the flip-flop 303_4 are 0. In other words, the outputs THR<1:N> of the flip-flops are 1 until a phase difference between the delay signals $IN_1<1:N>$ and the input signal $IN_2$ becomes smaller than T, and flip-flops receiving delay signals delayed after the input signal $IN_2$ output 0.

The selection signal generators 305 serves to detect a point where the outputs THR<1:N> of the flip-flops 303 are changed from 1 to 0 and find a signal most similar to the input signal $IN_2$ among the delay signals $IN_1<1:N>$. In FIG. 4, selection signals sel<1> and sel<2> are 0, and a selection signal sel<3> is 1. All of the outputs of the selection signal generators 305 except the selection signal sel<3> are 0.

The MUX 307 receiving the output signals of the selection signal generators 305 verifies that the selection signal sel<3> is 1, and outputs the delay signal $IN_1<3>$ as the output signal $OUT_1$.

Through the above-described process, the output signal $OUT_1$ becomes $IN_1<3>$, and the output signal $OUT_2$ becomes $IN_2$. Thus, the output signal $OUT_1$ compensated for a delay to have a phase difference equal to or smaller than the resolution T of the time to digital converter with respect to the output signal $OUT_2$ is input into the time to digital converter in the next stage together with the output signal $OUT_2$. In other words, the output signals $OUT_1$ and $OUT_2$ have a phase difference of D, and the phase difference of D may be detected by the time to digital converter having a more fine resolution in the next stage.

Figure 5:
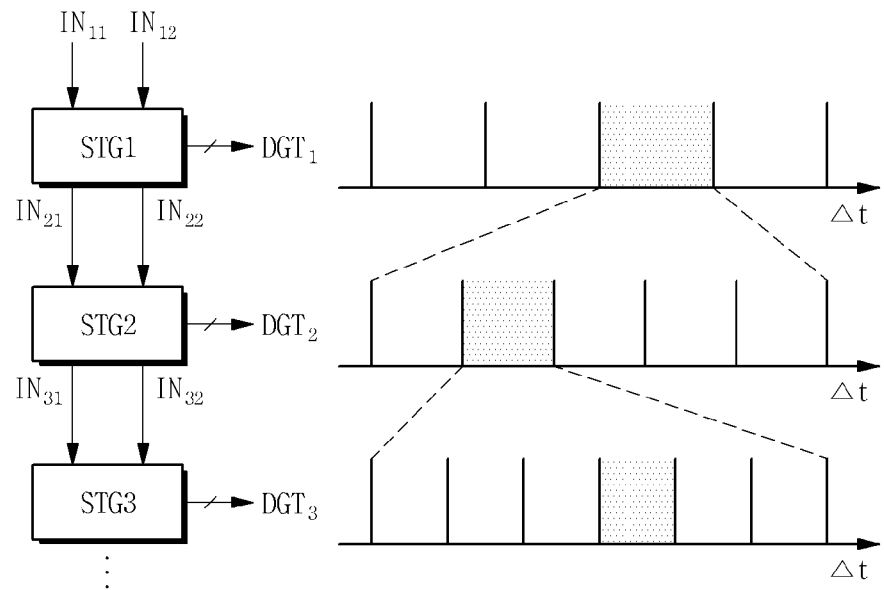
FIG. 5 is a block diagram of a time to digital converter having a hierarchical structure according to an exemplary embodiment of the present invention.

FIG. 5 is a block diagram of a time to digital converter having a hierarchical structure according to an exemplary embodiment of the present invention.

Referring to FIG. 5, a time to digital converter according to an exemplary embodiment of the present invention has a hierarchical structure. In the hierarchical structure, a time to digital converter having the lowest resolution but the widest phase detection range is employed in the initial stage, and time to digital converters having higher resolution but narrower phase detection range are employed sequentially in subsequent stages. A time to digital converter of each stage has the constitution described with reference to FIG. 3, but a conventional time to digital converter may be used as a time to digital converter in the last stage. The time to digital converter having a hierarchical structure in each stage compensates a signal for a detected phase and then outputs the compensated signal to the next stage, and a time to digital converter in the next stage reduces a phase detection range.

Figure 6:
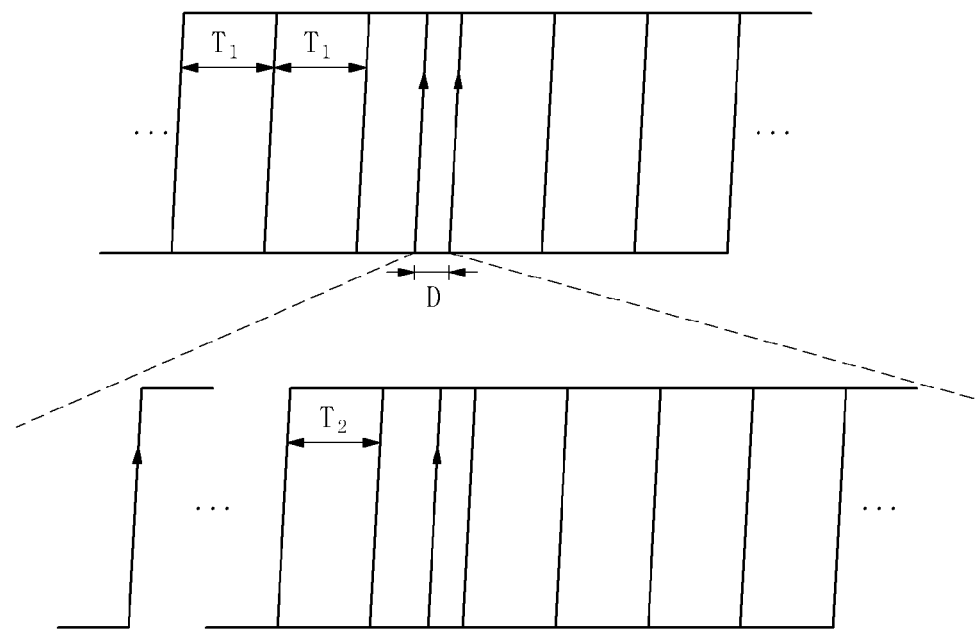
FIG. 6 shows an operational waveform of a time to digital converter having a hierarchical structure according to an exemplary embodiment of the present invention.

FIG. 6 shows an operational waveform of a time to digital converter having a hierarchical structure according to an exemplary embodiment of the present invention.

Referring to FIG. 6, a resolution of a time to digital converter in a stage is $T_1$, and the time to digital converter having the resolution of $T_1$ performs compensation on a phase difference to be D smaller than $T_1$. A time to digital converter in the next stage detects a phase difference D using a resolution $T_2$ smaller than the resolution $T_1$. When the phase difference D is not detected using the resolution $T_2$, it may be detected using a more fine resolution in the next stage.

As described above, the time to digital converter in a stage compensates a signal for a delay to make the delay less than $T_1$ and transfers the signal as an input of the time to digital converter in the next stage. Consequently, the time to digital converter in the next stage does not require many delay stages although it has a more fine resolution.

As apparent from the above description, a time to digital converter using a hierarchical structure according to an exemplary embodiment of the present invention has a drastically reduced number of delay stages while still satisfying a high resolution and a wide phase detection range. In addition, the reduction in number of delay stages leads to large reduction in size of a time to digital converter circuit.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A time to digital converter having a hierarchical structure, comprising:
    a first time to digital converter including
        delay stages having a delay time of $T_1$, compensating for a phase difference between two signals to be less than $T_1$ and generating a plurality of output signals, sequentially delaying a first signal of the two signals for a specific delay time, and outputting the output signals to a time to digital converter in a next stage,
        a plurality of flip-flops for comparing delay signals of the first signal delayed by the delay stages with a second signal of the two signals, and generating different outputs before and after a phase difference between the delay signals of the first signal and the second signal becomes smaller than a resolution of the time to digital converter,
        a selection signal generator for generating a selection signal for selecting a signal most similar to the second signal among the delay signals of the first signal from the outputs of the flip-flops, and
        a Multiplexer (MUX) for receiving the delay signals of the first signal and the selection signal, and outputting the signal most similar to the second signal among the delay signals of the first signal; and
    a second time to digital converter including delay stages having a delay time of $T_2$, and detecting a phase difference of the output by the first time to digital converter, wherein $T_1$ is greater than $T_2$.

2. The time to digital converter of claim 1, wherein outputs of the first time to digital converter are the second signal and the signal most similar to the second signal among the delay signals of the first signal.

3. The time to digital converter of claim 1, wherein the selection signal generator of the first time to digital converter includes an inverter gate and an AND gate.

4. The time to digital converter of claim 1, wherein the output signal of the MUX and the second signal of the first time to digital converter are input into a time to digital converter in a next stage.

5. The time to digital converter of claim 4, wherein the second signal of the first time to digital converter is passed through a buffer in consideration of an input load of the time to digital converter in the next stage.

6. The time to digital converter of claim 1, wherein the flip-flops of the first time to digital converter generate and output values of the delay signals of the first signal at a rising edge of the second signal.

7. The time to digital converter of claim 1, wherein the selection signal generator of the first time to digital converter receives outputs of two adjacent flip-flops, and generates and outputs the selection signal having a value of 1 when the outputs of the flip-flops are changed from 1 to 0.

8. The time to digital converter of claim 7, wherein the selection signal generator of the first time to digital converter includes an inverter gate and an AND gate.

9. A time to digital converter having a hierarchical structure, comprising:
    a first time to digital converter including
        delay stages having a delay time of $T_1$, compensating for a phase difference between two signals to be less than $T_1$, sequentially delaying a first signal among the two signals for a specific delay time, and outputting the compensated signals to a time to digital converter in a next stage,
        a plurality of flip-flops for comparing delay signals of the first signal delayed by the delay stages with a second signal among the two signals, and generating different outputs before and after a phase difference between the delay signals of the first signal and the second signal becomes smaller than a resolution of the time to digital converter,
        a selection signal generator for generating a selection signal for selecting a signal most similar to the second signal among the delay signals of the first signal from the outputs of the flip-flops, and
        a Multiplexer (MUX) for receiving the delay signals of the first signal and the selection signal, and outputting the signal most similar to the second signal among the delay signals of the first signal; and
    a second time to digital converter including delay stages having a delay time of $T_2$, and detecting a phase difference between the compensated signals output by the first time to digital converter, wherein $T_1$ is greater than $T_2$.

* * * * *